(12) United States Patent  (10) Patent No.: US 9,564,342 B2
Ogasawara  (45) Date of Patent: Feb. 7, 2017

(54) METHOD FOR CONTROLLING ETCHING IN PITCH DOUBLING

(71) Applicant: Tokyo Electron Limited, Tokyo (JP)

(72) Inventor: Kosuke Ogasawara, Portland, OR (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/859,826

(22) Filed: Sep. 21, 2015

(65) Prior Publication Data

US 2016/0093501 A1 Mar. 31, 2016

Related U.S. Application Data

(60) Provisional application No. 62/056,263, filed on Sep. 26, 2014.

(51) Int. Cl.
*H01L 21/302* (2006.01)
*H01L 21/311* (2006.01)

(52) U.S. Cl.
CPC .... *H01L 21/31116* (2013.01); *H01L 21/31122* (2013.01); *H01L 21/31138* (2013.01); *H01L 21/31144* (2013.01)

(58) Field of Classification Search
CPC .......... H01L 21/3065; H01L 21/30655; H01L 21/3086; H01L 21/31116; H01L 21/31138; H01L 21/31127
USPC ....... 438/706, 710, 712, 714, 717, 723, 725, 438/736
See application file for complete search history.

(56) References Cited

U.S. PATENT DOCUMENTS

| | | | |
|---|---|---|---|
| 5,328,810 A | 7/1994 | Lowrey et al. | |
| 7,989,307 B2 | 8/2011 | Parekh et al. | |
| 9,082,721 B2 * | 7/2015 | Keller | H01L 21/31122 |
| 2008/0108216 A1 * | 5/2008 | Lee | H01L 21/02063 |
| | | | 438/597 |
| 2008/0113483 A1 * | 5/2008 | Wells | H01L 21/0337 |
| | | | 438/424 |
| 2010/0216311 A1 * | 8/2010 | Tamaki | H01L 21/3065 |
| | | | 438/700 |
| 2010/0267237 A1 | 10/2010 | Bonser et al. | |
| 2013/0302987 A1 | 11/2013 | Abatchev et al. | |
| 2014/0045338 A1 * | 2/2014 | Tohnoe | H01L 21/3065 |
| | | | 438/719 |

* cited by examiner

*Primary Examiner* — Lan Vinh
(74) *Attorney, Agent, or Firm* — Oblon, McClelland, Maier & Neustadt, L.L.P.

(57) ABSTRACT

Embodiments of the invention describe a method for controlling etching in pitch doubling. According to one embodiment, the method includes receiving a substrate having a pattern thereon defined by spacers formed on sidewalls of a plurality mandrels, and transferring the pattern defined by the spacers into the substrate using a plasma etch process that etches the mandrels and the substrate, the transferring forming first recessed features in the substrate below the mandrels and second recessed features in the substrate between the mandrels, where the plasma etch process utilizes an etching gas containing $O_2$ gas, and the relative amount of $O_2$ gas in the etching gas is selected to control the depth of the first recessed features relative to the depth of second recessed features. According to another embodiment, the substrate contains a mask layer thereon and a pattern on the mask layer.

20 Claims, 2 Drawing Sheets

METHOD FOR CONTROLLING ETCHING
IN PITCH DOUBLING

CROSS-REFERENCE TO RELATED
APPLICATIONS

This application is related to and claims priority to U.S. Provisional Application No. 62/056,263, filed Sep. 26, 2014, the entire contents of which are herein incorporated by reference.

FIELD OF THE INVENTION

The present invention generally relates to etching in semiconductor manufacturing, and more particularly to a method of controlling etching in pitch doubling.

BACKGROUND OF THE INVENTION

Pitch multiplication is a class of technologies for manufacturing integrated circuits (ICs), developed for photolithography to enhance the feature density. Pitch doubling or double patterning techniques where a conventional lithography process is enhanced to produce double the expected number of features is the simplest case of pitch multiplication. One problem that arises during etching of a substrate using pitch doubled patterns is how to control difference in etch rate between different regions on a substrate.

SUMMARY OF THE INVENTION

According to embodiments of the invention, a method of forming semiconductor structures by Self-aligned Double Patterning (SADP) is described.

According to one embodiment, the method includes receiving a substrate having a pattern thereon defined by spacers formed on sidewalls of a plurality mandrels, and transferring the pattern defined by the spacers into the substrate using a plasma etch process that etches the plurality of mandrels and the substrate, the transferring forming first recessed features in the substrate below the mandrels and second recessed features in the substrate between the mandrels, where the plasma etch process utilizes an etching gas containing $O_2$ gas, and the relative amount of $O_2$ gas in the etching gas is selected to control the depth of the first recessed features relative to the depth of second recessed features.

According to another embodiment, the method includes receiving a substrate having a mask layer thereon and a pattern on the mask layer, the pattern defined by spacers formed on sidewalls of a plurality mandrels, and transferring the pattern defined by the spacers into the substrate using a plasma etch process that etches the mandrels, the mask layer, and the substrate, the transferring forming first recessed features in the mask layer and in the substrate below the mandrels and second recessed features in the mask layer and the substrate between the mandrels, where the plasma etch process utilizes an etching gas containing $O_2$ gas, and the relative amount of $O_2$ gas in the etching gas is selected to control the depth of the first recessed features relative to the depth of second recessed features.

DETAILED DESCRIPTION OF SEVERAL
EMBODIMENTS

Embodiments of the invention are described below in reference to the Figures. According to one embodiment, a method is provided for forming a semiconductor device. The method includes receiving a substrate having a pattern thereon defined by spacers formed on sidewalls of a plurality mandrels, and transferring the pattern defined by the spacers into the substrate using a plasma etch process that etches the mandrels and the substrate, the transferring forming first recessed features in the substrate below the mandrels and second recessed features in the substrate between the mandrels, where the plasma etch process utilizes an etching gas containing $O_2$ gas, and the relative amount of $O_2$ gas in the etching gas is selected to control the depth of the first recessed features relative to the depth of second recessed features.

Self-aligned Double Patterning (SADP) is a patterning technique that uses spacers formed adjacent to a template pattern (mandrels) that is defined by conventional lithography. After stripping the template material, the spacers serve as a hardmask with double the line density of the original lithographically defined template. Embodiments of the invention describe a method to control difference in etch rate between different regions on a substrate during etching of a substrate using SADP.

Figure 1:
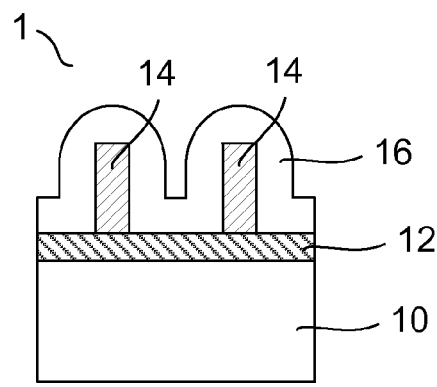
FIG. 1 schematically shows a cross-sectional view of a layered structure on a substrate.

FIG. 1 schematically shows a cross-sectional view of a layered structure 1 on a substrate 10. The layered structure 1 includes an oxide layer 16 that is conformally deposited on mandrels 14. The mandrels 14 are formed on a mask layer 12 on the substrate 10. According to some embodiments, the mask layer 12 may be omitted and the mandrels 14 formed directly on the substrate 10. In one example, the substrate 10 can contain an amorphous carbon layer (ACL), but other substrate materials may be used. The mandrels 14 can include a patterned photoresist (PR) layer, the mask layer 12 can include a silicon anti-reflective coating (SiARC, an organic bottom ARC that contains Si), and the oxide layer 16 can include $SiO_2$. The layered structure 1 can be fabricated using well known lithography and film deposition methods in semiconductor manufacturing. For simplicity, FIG. 1 only shows two (2) mandrels, but semiconductor manufacturing commonly uses a large number of such mandrels.

Figure 2:
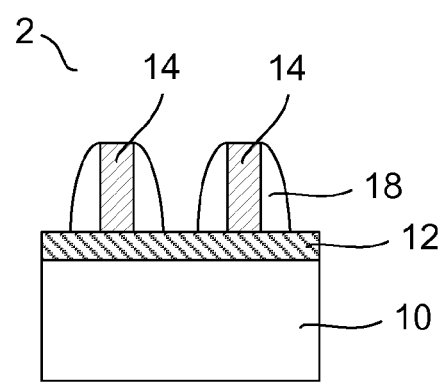
FIG. 2 schematically shows a cross-sectional view of a layered structure following a spacer etch of the structure in FIG. 1.

FIG. 2 schematically shows a cross-sectional view of a layered structure 2 following a spacer etch of the layered structure 1 in FIG. 1. The spacer etch process forms a pattern defined by the spacers 18 on the sidewalls of the mandrels 14. The spacer etch can utilize a capacitively coupled plasma (CCP) reactor or other types of plasma reactors, for example an inductively coupled plasma (ICP) reactor, or a microwave plasma reactor. In one example, a CCP reactor was used where 600 W at 60 MHz was applied to the upper electrode and 50 W at 13.56 MHz was applied to the lower electrode (substrate holder). The reactor pressure was 100 mTorr, the etch time was 90 seconds, and the substrate temperature was about 40-80° C. The etch gas contained $CF_4$ (150 sccm) and $CHF_3$ (100 sccm).

According to embodiments of the invention, the pattern defined by the spacers 18 may be transferred into the mask layer 12 and into the substrate 10 by an etching process, thereby forming recessed features in the mask layer 12 and in the substrate 10 below and/or between the mandrels 14. According to one embodiment, an etching gas can include $O_2$ and a halogen-containing gas. The halogen-containing gas can, for example, include a silicon-halogen-containing gas. The silicon-halogen-containing gas can, for example, be selected from the group consisting of $SiF_4$ and $SiCl_4$. According to one embodiment, the etching gas may be pulsed during the etching process to further control the etch rate in the recessed features.

Figure 3:
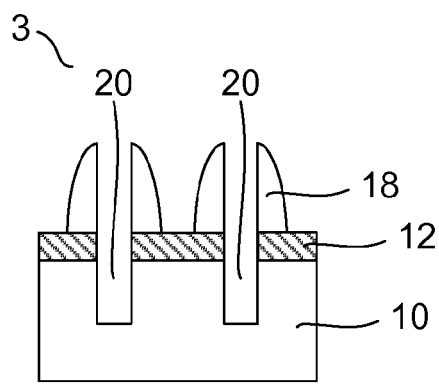
FIGS. 3-5 schematically shows cross-sectional views of layered structures on a substrate following etching of the structure in FIG. 2 according to embodiments of the invention.

FIG. 3 schematically shows a cross-sectional view of a layered structure 3 on the substrate 10. In one example, the layered structure 3 was formed using a selective etch that utilized a CCP reactor where 600 W at 60 MHz was applied to the upper electrode and 200 W at 13.56 MHz was applied to the lower electrode (substrate holder). The reactor pressure was 40 mTorr, the etch time was 60 seconds, and the substrate temperature was about 40° C. The etching gas contained $SiF_4$ (20 sccm), $O_2$ (10 sccm), and Ar (300 sccm). The selective etch process transferred the pattern defined by the spacers 18 into the mask layer 12 and into the substrate 10 below the mandrels 14, thereby forming first recessed features 20 in the mask layer 12 and in the substrate 10 below the mandrels 14. However, little or no etching of the mask layer 12 was observed in the open areas between the mandrels 14.

Figure 4:
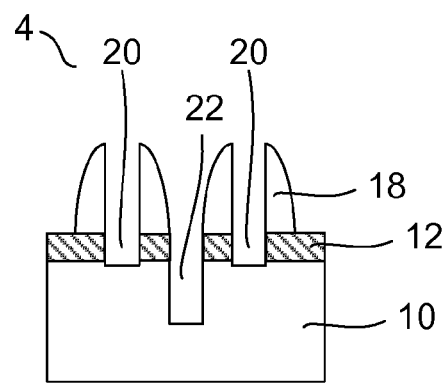

FIG. 4 schematically shows a cross-sectional view of a layered structure 4 on the substrate 10. The layered structure 4 was formed using a selective etch that utilized a CCP reactor where 600 W was applied to the upper electrode and 200 W was applied to the lower electrode (substrate holder). The reactor pressure was 40 mTorr, the etch time was 45 seconds, and the substrate temperature was about 40° C. The etching gas contained $SiF_4$ (20 sccm), $O_2$ (5 sccm), and Ar (300 sccm). The selective etch process transferred the pattern defined by the spacers 18 into the mask layer 12 and into the substrate 10, thereby forming first recessed features 20 in the mask layer 12 and in the substrate 10 below the mandrels 14, and forming second recessed features 22 in the mask layer 12 and in the substrate 10 between the mandrels 14.

The first recessed features 20 may be referred to as being in PR open regions or mandrel open regions, and the second recessed features 22 may be referred to as valley open regions, indicating the regions between the mandrels 14. Those skilled in the art will readily realize that these different regions can have very different etch rates and that successful double patterning manufacturing schemes will require good control over the depth of the first and second recessed features 20, 22. In particular, for some semiconductor devices, forming recessed features with the same or substantially the same depth will be required. The inventors have discovered that the relative amount of $O_2$ gas in the etching gas may be selected to achieve this. It is speculated that the amount of $O_2$ in the etching gas compensates for an aspect ratio effect and other differences between the first and second recessed features 20, 22.

Figure 7:
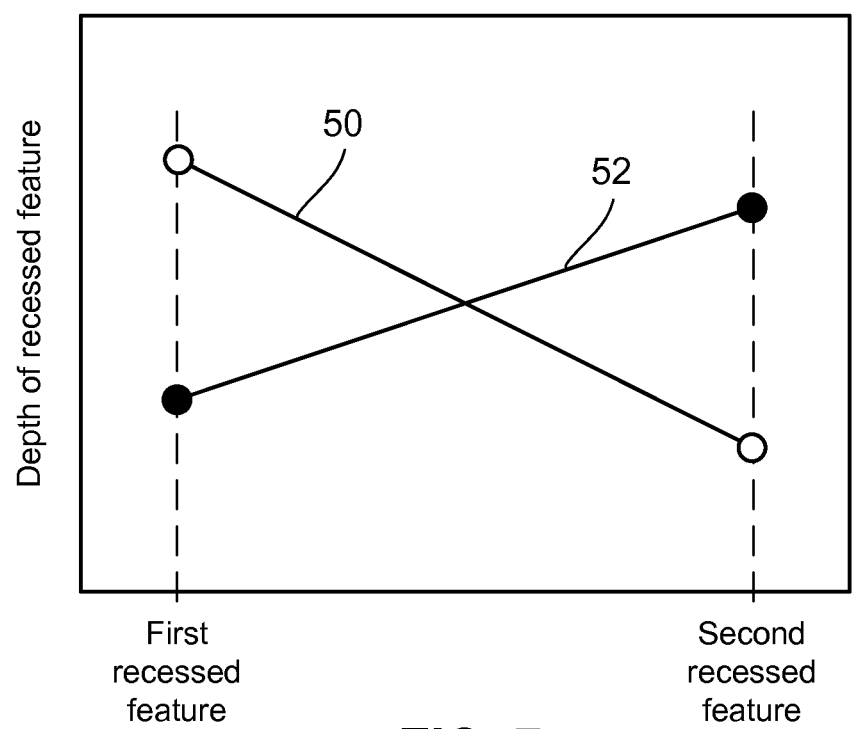
FIG. 7 schematically shows the depth of first and second recessed features for the processing conditions in FIGS. 3 and 4.

FIG. 7 schematically shows the depth of the first and second recessed features 20, 22 for the two different $O_2$ gas flows in FIGS. 3 and 4. The curve 50 shows the depth of the first and second recessed features 20, 22 for an $O_2$ gas flow of 10 sccm in FIG. 3, and the curve 52 shows the depth of the first and second recessed features 20, 22 for an $O_2$ gas flow of 5 sccm in FIG. 4. FIG. 7 shows that an etching recipe may readily be selected where the curves 50 and 52 are substantially horizontal, which provides first and second recessed features 20, 22 with the same or substantially the same depths.

Figure 5:
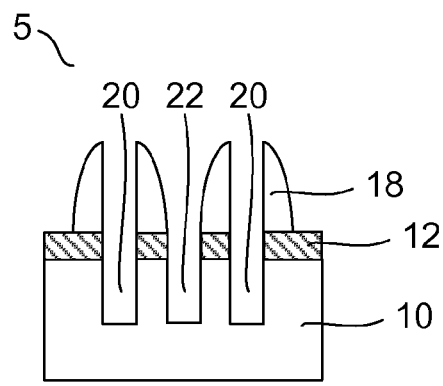

Thus, as schematically shown in FIG. 5, an etching recipe may be selected that achieves first and second recessed features 20, 22 having the same or substantially the same depth. The selected etching recipe can contain less $O_2$ in the etching gas than the etching recipe in FIG. 3, but contain more $O_2$ in the etching gas than the etching recipe in FIG. 4. In some embodiments, the first and second recessed features 20, 22 may have different widths and/or aspect ratios.

Figure 6:
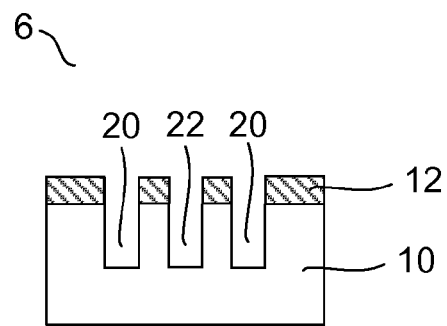
FIG. 6 schematically shows a cross-sectional view of a layered structure on a substrate following further processing of the structure in FIG. 5.

The layered structure 5 in FIG. 5 may be further processed and the spacers 18 removed as schematically shown in FIG. 6. Thereafter, the recessed features 20, 22 in the substrate 10 may be used as a mask to etch a layer or multiple layers underneath the substrate 10.

A plurality of embodiments for controlling etching in pitch doubling have been described. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. It is therefore intended that the scope of the invention be limited not by this detailed description, but rather by the claims appended hereto.

What is claimed is:

1. A method of forming semiconductor structures, the method comprising:
   receiving a substrate having a pattern thereon defined by spacers formed on sidewalls of a plurality mandrels, the substrate having first regions corresponding to an area of the mandrels and second regions corresponding to an area between the mandrels;
   transferring the pattern defined by the spacers into the substrate using a plasma etch process that etches the mandrels and the substrate, the transferring forming first recessed features etched partially through the substrate in the first regions below the mandrels, and second recessed features etched partially through the substrate in the second regions between the mandrels, wherein the plasma etch process utilizes an etching gas containing $O_2$ gas; and
   selecting a relative amount $O_2$ gas in the etching gas to compensate for differences in etch rate characteristics among the first and second regions to control the depth of the first recessed features relative to the depth of second recessed features.

2. The method of claim 1, further comprising:
   selecting an amount of $O_2$ gas in the etching gas such that a depth of the first recessed features is greater than the depth of the second recessed features.

3. The method of claim 1, further comprising:
   selecting an amount of $O_2$ gas in the etching gas such that a depth of the first recessed features is smaller than the depth of the second recessed features.

4. The method of claim 1, further comprising:
selecting an amount of $O_2$ gas in the etching gas such that a depth of the first recessed features is substantially the same as the depth of the second recessed features.

5. The method of claim 1, wherein the etching gas further contains a halogen-containing gas.

6. The method of claim 1, wherein the etching gas further contains a silicon-halogen-containing gas.

7. The method of claim 6, wherein the silicon-halogen-containing gas is selected from the group consisting of $SiF_4$ and $SiCl_4$.

8. The method of claim 1, wherein the spacers contain $SiO_2$.

9. The method of claim 1, wherein the mandrels contain a photoresist.

10. The method of claim 1, wherein the substrate contains a carbon-containing material.

11. A method of forming semiconductor structures, the method comprising:
receiving a substrate having a mask layer thereon and a pattern on the mask layer, the pattern defined by spacers formed on sidewalk of a plurality mandrels, the substrate having, first regions corresponding to an area of the mandrels and second regions corresonding to an area between the mandrels;
transferring the pattern defined by the spacers into the substrate using a plasma etch process that etches the mandrels, the mask layer, and the substrate, the transferring forming first recessed features etched through the mask layer and partially through the substrate in the first regions below the mandrels, and second recessed features etched through the mask layer and partially through the substrate in the second regions between the mandrels, wherein the plasma etch process utilizes an etching gas containing $O_2$ gas; and
selecting a relative amount of $O_2$ gas in the etching gas to compensate for differences in etch rate characteristics among the first and second regions to control the depth of the first recessed features relative to the depth of second recessed features.

12. The method of claim 11, further comprising:
selecting an amount of $O_2$ gas in the etching gas such that a depth of the first recessed features is greater than the depth of the second recessed features.

13. The method of claim 11, further comprising:
selecting an amount of $O_2$ gas in the etching gas such that a depth of the first recessed features is smaller than the depth of the second recessed features.

14. The method of claim 11, further comprising:
selecting an amount of $O_2$ gas in the etching gas such that a depth of the first recessed features is substantially the same as the depth of the second recessed features.

15. The method of claim 11, wherein the etching gas comprises $O_2$ and a halogen-containing gas.

16. The method of claim 11, wherein the etching gas comprises $O_2$ and a silicon-halogen-containing gas selected from the group consisting of $SiF_4$ and $SiCl_4$.

17. The method of claim 11, wherein the spacers contain $SiO_2$.

18. The method of claim 11, wherein the mandrels contain a photoresist.

19. The method of claim 11, wherein the substrate contains a carbon-containing material.

20. The method of claim 11, wherein the mask layer contains a silicon-containing antireflective coating (SiARC).

* * * * *